United States Patent
Takeuchi et al.

(10) Patent No.: US 6,232,765 B1
(45) Date of Patent: May 15, 2001

(54) ELECTRO-OPTICAL OSCILLOSCOPE WITH IMPROVED SAMPLING

(75) Inventors: Nobuaki Takeuchi; Yoshiki Yanagisawa; Jun Kikuchi; Nobukazu Banjo; Yoshio Endou; Mitsuru Shinagawa; Tadao Nagatsuma; Junzo Yamada, all of Tokyo (JP)

(73) Assignees: Ando Electric Co., LTD; Nippon Telegraph and Telephone Corporation, both of Tokyo (JP)

(*) Notice: Subject to any disclaimer, the term of this patent is extended or adjusted under 35 U.S.C. 154(b) by 0 days.

(21) Appl. No.: 09/268,136

(22) Filed: Mar. 12, 1999

(30) Foreign Application Priority Data

Mar. 19, 1998 (JP) .................................................. 10-070872

(51) Int. Cl.$^7$ ............................ G01R 19/00; G01R 23/16
(52) U.S. Cl. ......................... 324/121 R; 324/96; 324/753
(58) Field of Search .............................. 324/158.1, 73.1, 324/121 R, 750, 753, 96; 250/227.17, 25; 356/351, 304; 702/66, 76

(56) References Cited

U.S. PATENT DOCUMENTS 3,925,727 * 12/1975 Duguay ........................... 324/121 R
4,271,391 *  6/1981 Kmetz ............................. 324/121 R

FOREIGN PATENT DOCUMENTS

| 5-40158 | 2/1993 | (JP) . |
| 5-47883 | 2/1993 | (JP) . |
| 5-72299 | 3/1993 | (JP) . |
| 5-80083 | 3/1993 | (JP) . |
| 5-240895 | 9/1993 | (JP) . |
| 6-94807 | 4/1994 | (JP) . |
| 7-55497 | 3/1995 | (JP) . |
| 7-55891 | 3/1995 | (JP) . |
| 8-43499 | 2/1996 | (JP) . |
| 8-152361 | 6/1996 | (JP) . |
| 8-160110 | 6/1996 | (JP) . |
| 8-262117 | 10/1996 | (JP) . |
| 9-159733 | 6/1997 | (JP) . |
| 9-197019 | 7/1997 | (JP) . |
| 9-211035 | 8/1997 | (JP) . |

OTHER PUBLICATIONS

M. Shinagawa, et al., "A High–Impedance Probe Based on Electro–Optic Sampling", Proceedings of 15$^{th}$ Meeting on Lightwave Sensing Technology, LST 15–17, May, 1995.

* cited by examiner

Primary Examiner—Vinh P. Nguyen
(74) Attorney, Agent, or Firm—Darby & Darby

(57) ABSTRACT

An electro-optic sampling oscilloscope (or EOS oscilloscope) is designed to perform measurement such that an electro-optic sampling probe (i.e., EOS probe) is brought into contact with a measured circuit. Optical pulses are input to the EOS probe, wherein they are varied in polarization states in response to the measured circuit. Then, an electric signal output from the EOS probe is amplified to produce a receiving light signal. The receiving light signal is subjected to sampling operations using a first pulse signal to produce detection data, while it is also subjected to sampling operations using a second pulse signal to produce noise data. Herein, the first pulse signal consists of pulses which emerge in synchronization with the optical pulses respectively, while the second pulse signal delays from the first pulse signal by a prescribed delay time. Then, measurement data are produced by subtracting the noise data from the detection data. The measurement data are processed so that a measured waveform representing a measurement result is displayed on a screen of the EOS oscilloscope. Thus, it is possible to obtain the measured waveform with high precision and a good S/N ratio by eliminating low-frequency noise components from the measurement results.

10 Claims, 11 Drawing Sheets

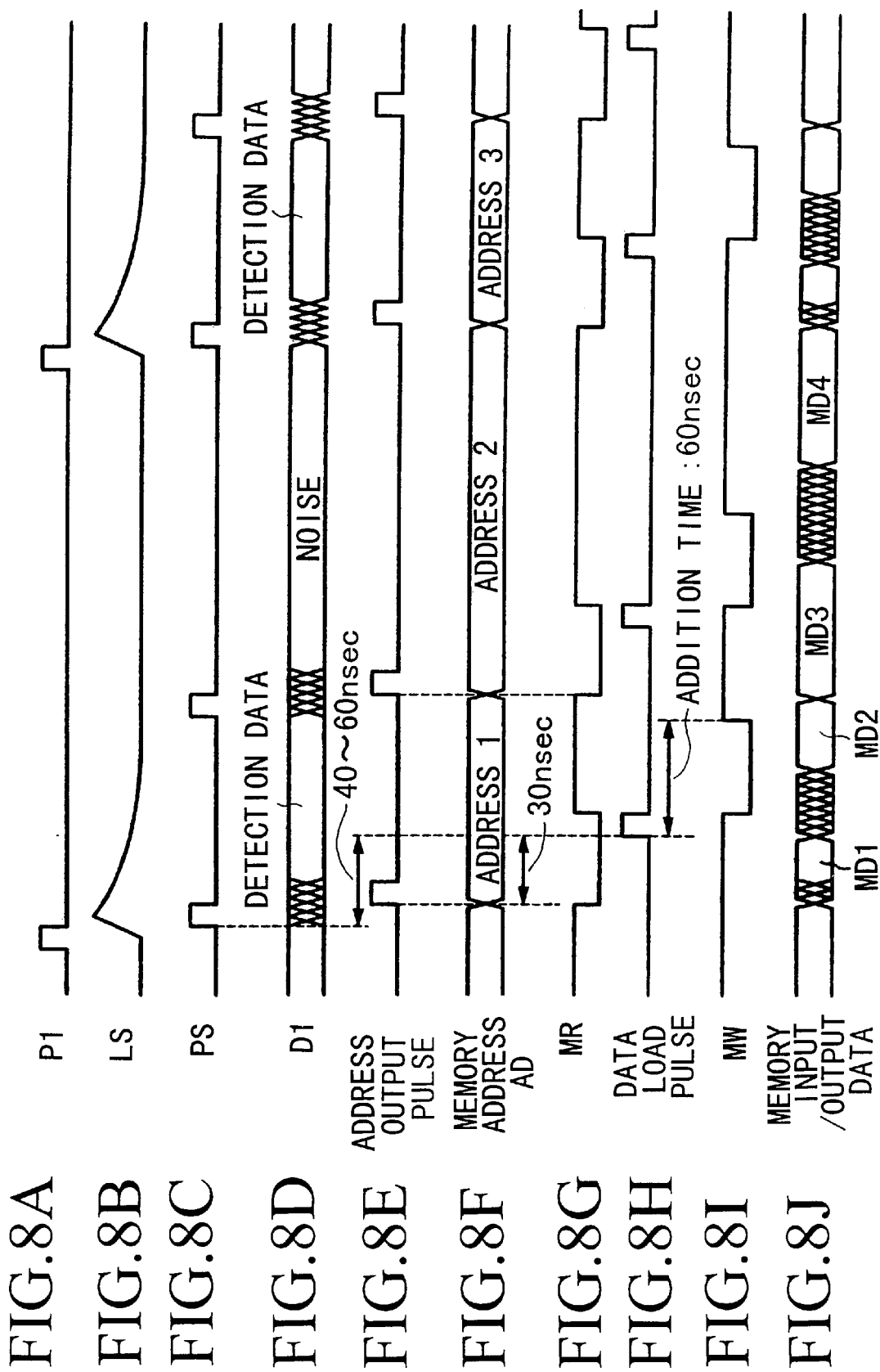

| ADDRESS OF MEMORY 40 | CONTENTS OF DATA |
| --- | --- |
| 1 | FIRST DETECTION DATA   a |
| 2 | FIRST NOISE DATA   b |
| 3 | SECOND DETECTION DATA   c |
| 4 | SECOND NOISE DATA   d |
| ⋮ | ⋮ |

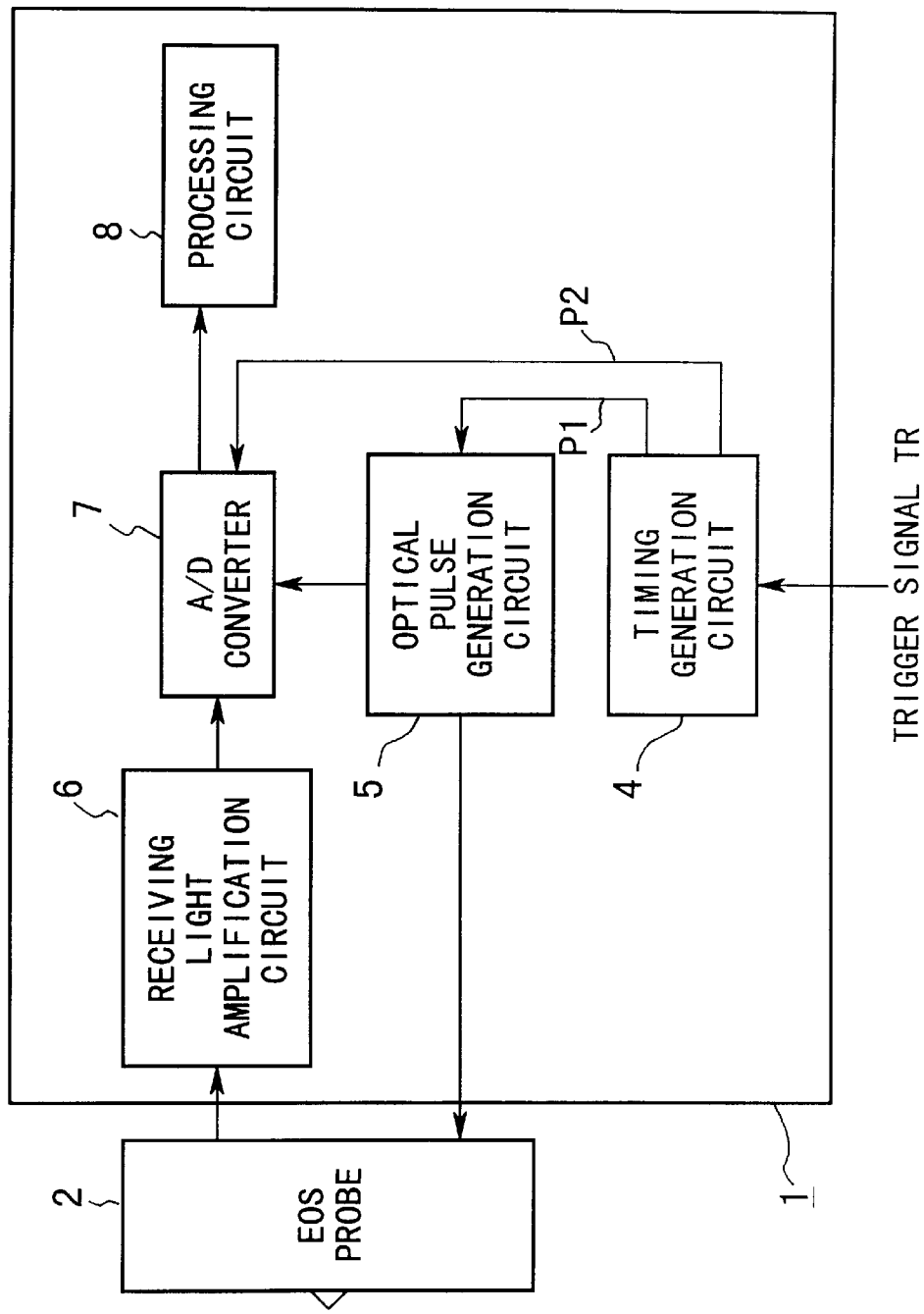

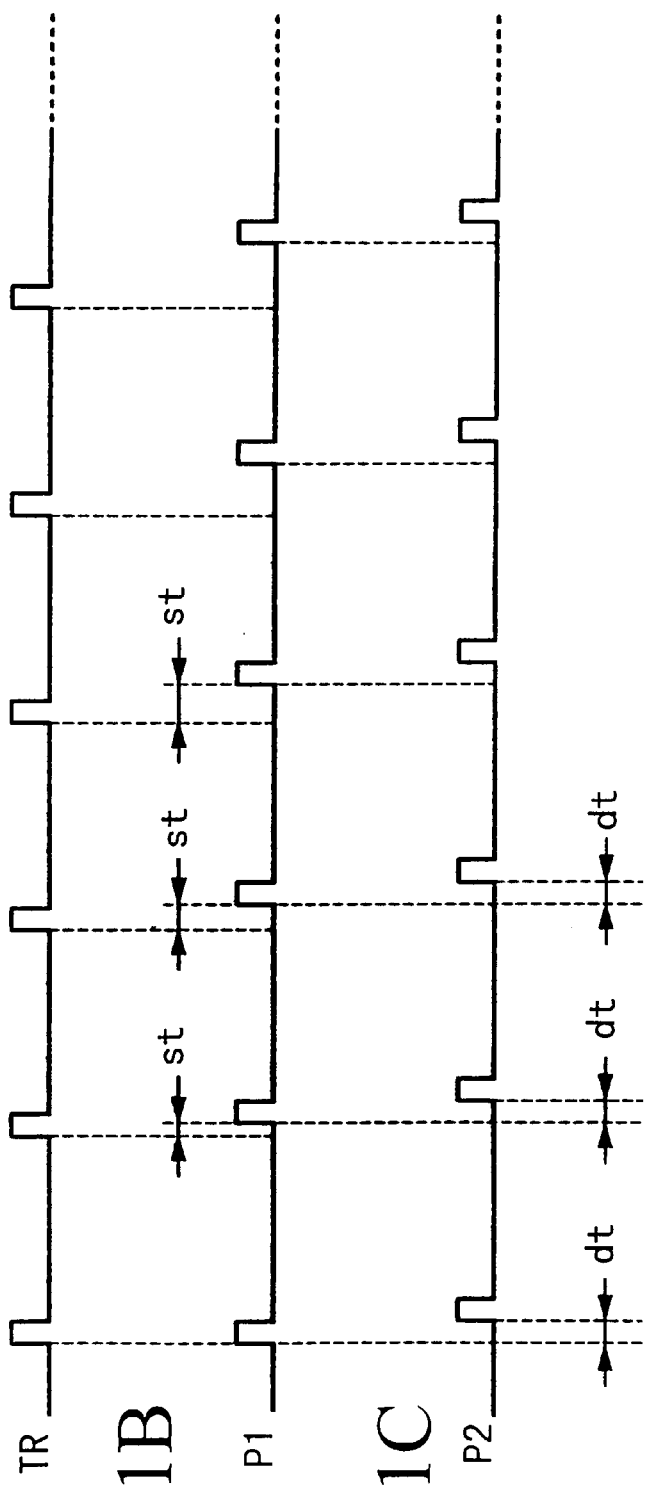

2

ELECTRO-OPTICAL OSCILLOSCOPE WITH IMPROVED SAMPLING

BACKGROUND OF THE INVENTION

1. Field of the Invention

This invention relates to electro-optic sampling oscilloscopes that are used for observation of waveforms of measured signals which are detected by electro-optic sampling probes.

This application is based on Patent Application No. Hei 10-70872 filed in Japan, the content of which is incorporated herein by reference.

2. Description of the Related Art

The electro-optic sampling oscilloscopes operate using electro-optic sampling probes (where the term of "electro-optic sampling" can be abbreviated by "EOS") based on the known phenomena as follows:

Electric fields are produced by measured signals and are connected with electro-optic crystals, on which laser beams are incident. Based on polarization states of the laser beams, it is possible to measure waveforms of the measured signals. Herein, sampling operations are performed on the measured signals under the condition where the laser beams are made in form of pulses, so it is possible to measure the waveforms with a very high resolution.

The electro-optic sampling oscilloscopes (or "EOS oscilloscopes") have a variety of technical features and therefore attract attention to engineers, which is described in pp. 123–129 of the paper entitled "A High-Impedance Probe Based on Electro-Optic Sampling" written by Shinagawa and other members and published as the lectured monographs of the proceedings of $15^{th}$ Meeting of the Institute of Lightwave Sensing Technology under the names of the Institute of Applied Physics and Institute of Lightwave Sensing Technology on May of 1995. The features of the EOS oscilloscopes are as follows:

(1) It is easy to perform the measurement on signals because the EOS oscilloscopes do not require ground lines.

(2) A metal pin located at a tip end of the EOS probe is insulated from the circuitry, so it is possible to realize the high-input impedance which results in an ideal state that substantially no disturbances occur on states of the measuring points.

(3) It is possible to actualize measurement of the broad frequency band up to GHz order because the EOS oscilloscopes use optical pulses for the measurement.

FIG. 10 is a block diagram showing an example of a configuration of the EOS oscilloscope, which is basically constructed by a main body 1 and a EOS probe 2 for receiving light (beams) corresponding to measured signals. Herein, a trigger signal TR is a periodically varying signal which synchronizes with clock pulses for driving a measured circuit (not shown) which is subjected to measurement. Therefore, the measured circuit supplies the trigger signal TR to the main body 1. Based on the trigger signal TR, a timing generation circuit 4 generates a pulse signal P1 for driving an optical pulse generation circuit 5 as well as a pulse signal P2 for driving an analog-to-digital converter (abbreviated by "A/D converter") 7. FIG. 11A is a time chart showing the trigger signal TR consisting of trigger pulses which periodically emerge; FIG. 11B is a time chart showing the pulse signal P1; and FIG. 11C is a time chart showing the pulse signal P2. Each of pulses of the pulse signal P1 is delayed from each of the trigger pulses of the trigger signal TR in such a way that a delay time "st" therebetween is gradually increased. In addition, each of pulses of the pulse signal P2 is delayed from each of the trigger pulses of the trigger signal TR by a prescribed and fixed delay time "dt".

The optical pulse generation circuit 5 receives the pulse signal P1 to generate optical pulses of laser beams, which are supplied to the EOS probe 2. When the optical pulse passes through the EOS probe 2, a polarization state thereof changes in response to a signal at a probe contact portion of the measured circuit. Then, the optical pulses whose polarization states are changed are converted to electric signals, which are supplied to a receiving light amplification circuit 6. The receiving light amplification circuit 6 amplifies output of the EOS probe 2 so as to produce a receiving light signal LS, which is then forwarded to the A/D converter 7. The A/D converter 7 performs sampling operations on the receiving light signal LS based on the pulse signal P2, so that the receiving light signal LS is subjected to analog-to-digital conversion. Then, a processing circuit 8 performs a display process of measured waveforms based on digital output of the A/D converter 7.

The aforementioned EOS oscilloscope suffers from a problem due to sampling of signals, as follows:

At sampling, external noise is input to the receiving light amplification circuit. Or, the EOS oscilloscope inevitably performs sampling operations on low-frequency noise components such as the noise (e.g., shot noise, heat noise and 1/f noise) caused by the receiving light amplification circuit and the optical noise (e.g., noise components on light beams produced by LEDs). Therefore, performance of the EOS oscilloscope is deteriorated in S/N ratio.

SUMMARY OF THE INVENTION

It is an object of the invention to provide an electro-optic sampling oscilloscope that is capable of improving a S/N ratio.

An electro-optic sampling oscilloscope (or EOS oscilloscope) of this invention is designed to perform measurement such that an electro-optic sampling probe (or EOS probe) is brought into contact with a measured circuit. Optical pulses are input to the EOS probe, wherein they are varied in polarization states in response to the measured circuit. Then, an electric signal output from the EOS probe is amplified to produce a receiving light signal. The receiving light signal is subjected to sampling operations using a first pulse signal to produce detection data, while it is also subjected to sampling operations using a second pulse signal to produce noise data. Herein, the first pulse signal consists of pulses which emerge in synchronization with the optical pulses respectively, while the second pulse signal delays from the first pulse signal by a prescribed delay time.

The EOS oscilloscope is capable of controlling a frequency band used for amplification as well as the delay time. For example, the delay time is made longer as the frequency band becomes narrower.

Then, measurement data are produced by subtracting the noise data from the detection data. The measurement data are processed so that a measured waveform representing a measurement result is displayed on a screen of the EOS oscilloscope.

Thus, it is possible to obtain the measured waveform with a good S/N ratio by eliminating (or reducing) low-frequency noise components from the measurement results.

BRIEF DESCRIPTION OF THE DRAWINGS

These and other objects, aspects and embodiment of the present invention will be described in more detail with reference to the following drawing figures, of which:

FIG. 8A is a time chart showing a pulse signal P1 in FIG. 7;

FIG. 8B is a time chart showing a receiving light signal LS in FIG. 7;

FIG. 8C is a time chart showing a sampling pulse signal PS in FIG. 7;

FIG. 8D is a time chart showing data D1 which are produced based on the receiving light signal LS in FIG. 7;

FIG. 8E is a time chart showing an address pulse signal which is created in a memory control circuit shown in FIG. 7;

FIG. 8F is a time chart showing content of data representing memory addresses AD for accessing a memory shown in FIG. 7;

FIG. 8G is a time chart showing a memory read signal MR;

FIG. 8H is a time chart showing data load pulses;

FIG. 8I is a time chart showing a memory write signal MW;

FIG. 8J is a time chart showing memory input/output data;

FIG. 10 is a block diagram showing an example of a configuration of the EOS oscilloscope;

FIG. 11A is a time chart showing the trigger signal TR in FIG. 10;

FIG. 11B is a time chart showing the pulse signal P1 in FIG. 10; and

FIG. 11C is a time chart showing the pulse signal P2 in FIG. 10.

DESCRIPTION OF THE PREFERRED EMBODIMENT

This invention will be described in further detail by way of examples with reference to the accompanying drawings.

Figure 1:
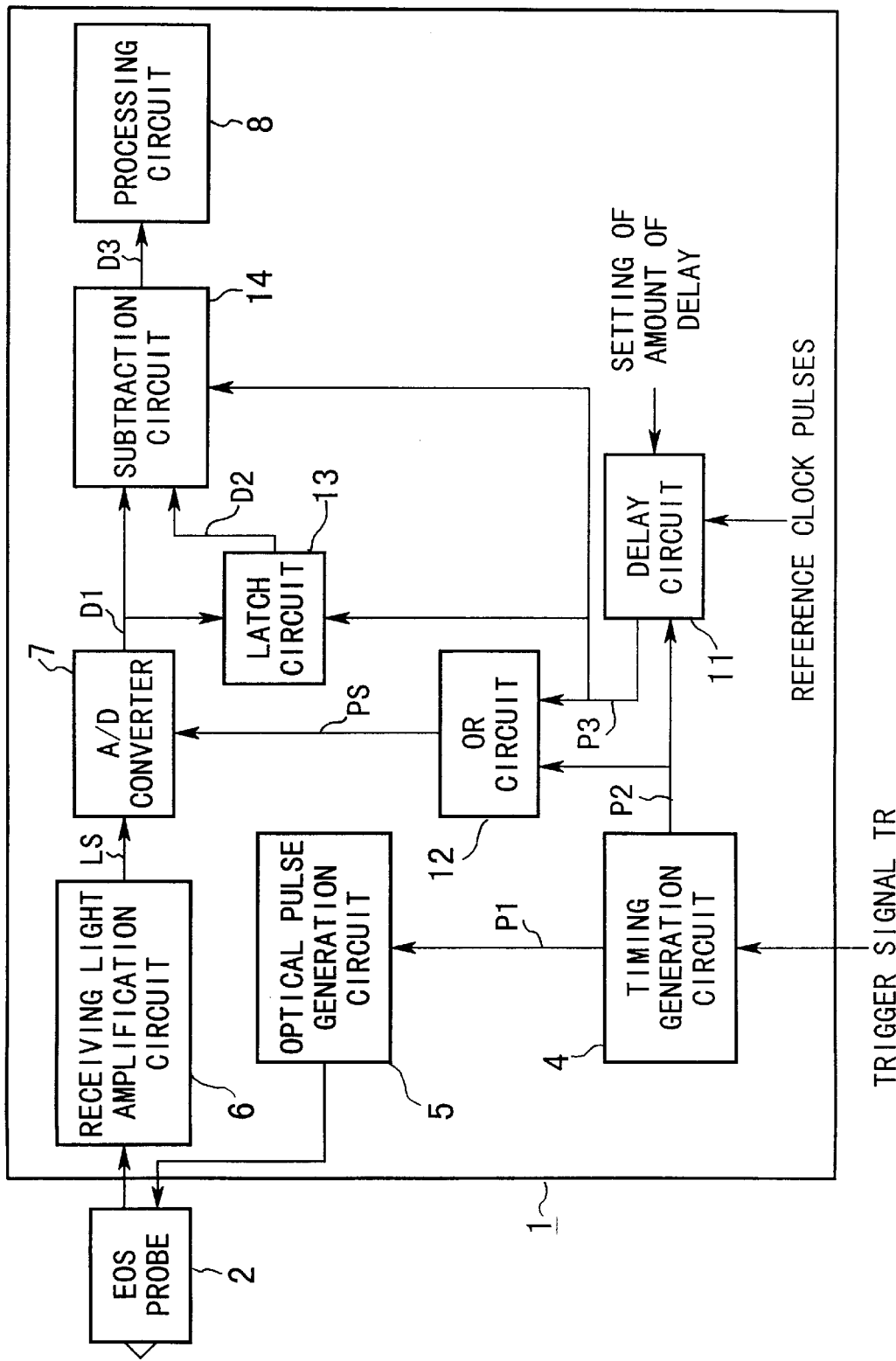
FIG. 1 is a block diagram showing a circuit configuration of an EOS oscilloscope in accordance with an embodiment of the invention.

FIG. 1 is a block diagram showing a configuration of an EOS oscilloscope in accordance with an embodiment of the invention, wherein parts identical to those shown in FIG. 10 will be designated by the same reference symbols, hence, the description thereof will be omitted.

Figure 2:
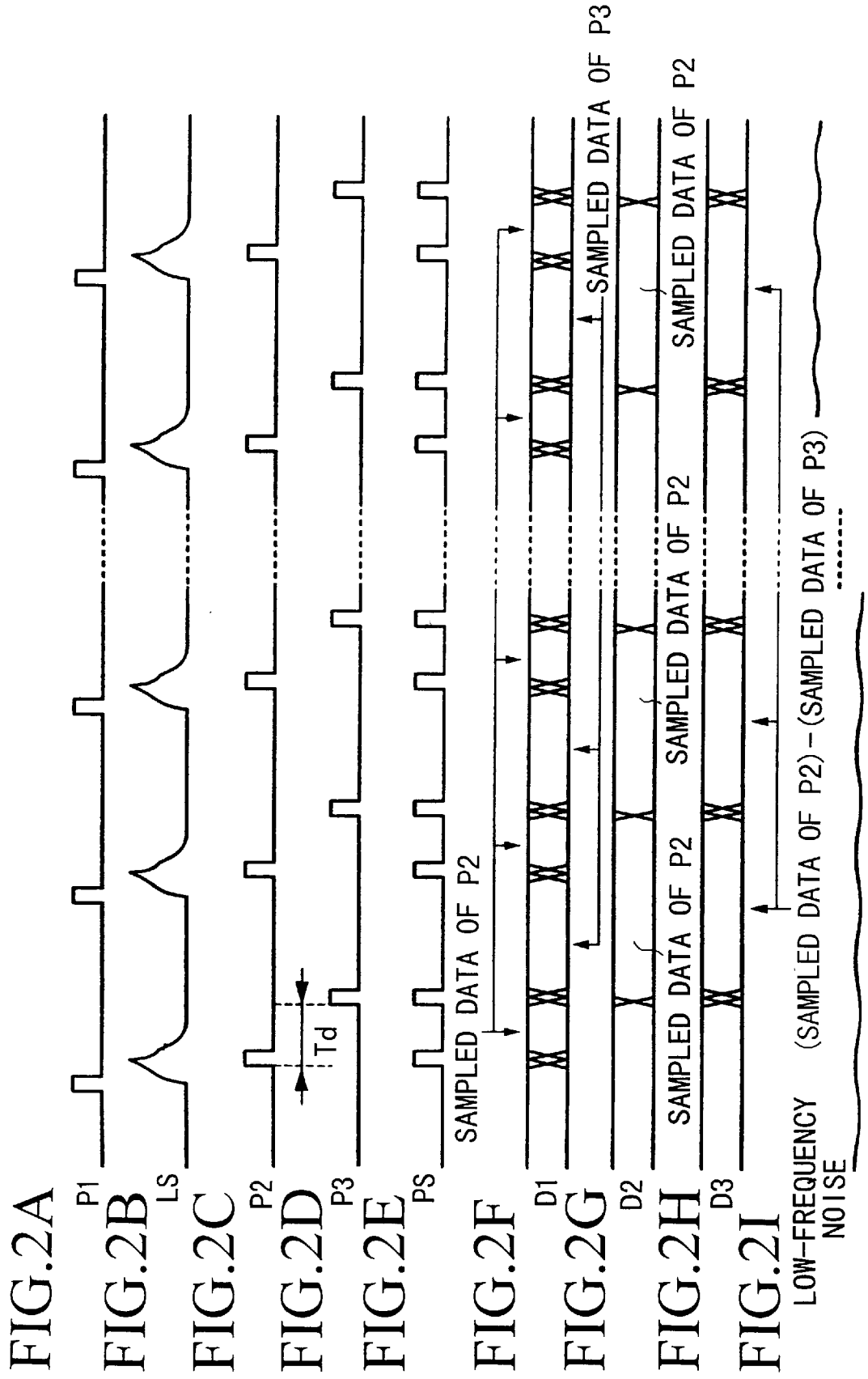
FIG. 2A is a time chart showing a pulse signal P1.
FIG. 2B is a time chart showing an example of a waveform of a receiving light signal LS.
FIG. 2C is a time chart showing a pulse signal P2.
FIG. 2D is a time chart showing a pulse signal P3 which delays from the pulse signal P2.
FIG. 2E is a time chart showing a sampling pulse signal PS based on the pulse signals P2 and P3.
FIG. 2F is a time chart showing digital data D1 which are produced based on the receiving light signal LS.
FIG. 2G is a time chart showing data D2 which are produced by latching the data D1.
FIG. 2H is a time chart showing data D3 which are produced by subtracting the data D1 from the data D2.
FIG. 2I is a time chart showing an example of low-frequency noise.

In FIG. 1, a delay circuit 11 delays a pulse signal P2 (see FIG. 11C and FIG. 2C), output from the timing generation circuit 4, by a prescribed delay time so as to produce a pulse signal P3 (see FIG. 2D). Herein, the pulse signal P3 delays from the pulse signal P2 by a delay time Td, which is measured by counting a number of reference clock pulses which corresponds to a preset amount of delay. An OR circuit 12 performs a logical operation of "OR" on the pulse signals P2 and P3. So, the OR circuit 12 supplies the A/D converter 7 with a result of the logical operation of "OR", namely, a sampling pulse signal PS (see FIG. 2E). So, the A/D converter 7 converts a receiving light signal LS (see FIG. 2B), output from the receiving light amplification circuit 6, on the basis of the pulse signal PS so as to produce digital data D1 (see FIG. 2F). A latch circuit 13 latches such an output of the A/D converter 7 at the timing designated by the pulse signal P3. Then, the latch circuit 13 outputs data D2 (see FIG. 2G), which are forwarded to a subtraction circuit 14. The subtraction circuit 14 subtracts the output data D1 of the A/D converter 7 from the output data D2 of the latch circuit 13 to produce data D3 (see FIG. 2H), which are forwarded to the processing circuit 8.

Next, operations of the EOS oscilloscope of FIG. 1 will be described with reference to time charts of FIG. 2A to FIG. 2I. At leading-edge timings of trigger pulses of the trigger signal TR (see FIG. 11A) at which the trigger signal TR supplied from the measured circuit rises in level, the timing generation circuit 4 sequentially outputs pulses of the pulse signal P1 shown in FIG. 2A, which is supplied to the optical pulse generation circuit 5. Upon receipt of the pulse signal P1, optical pulse generation circuit 5 generates optical pulses using laser beams. So, the optical pulse generation circuit 5 outputs the optical pulses to the EOS probe 2. Every time the optical pulse passes through the EOS probe 2, it changes in polarization state in response to the measured signal. Thus, the optical pulses which are changed in polarization states are converted to electric signals, which are input to the receiving light amplification circuit 6. The receiving light amplification circuit 6 amplifies an output of the EOS probe 2 to produce a receiving light signal LS, which is forwarded to the A/D converter 7. FIG. 2B shows an example of a waveform of the receiving light signal LS.

When a prescribed time (e.g., 10 to 50 nanoseconds) elapses after the leading-edge timing of the pulse of the pulse signal P1, the timing generation circuit 4 outputs a pulse of the pulse signal P2 shown in FIG. 2C. This pulse P2 is supplied to the A/D converter 7 via the OR circuit 12 as a sampling pulse of the sampling pulse signal PS shown in FIG. 2E. Upon receipt of the sampling pulses PS, the A/D converter 7 performs sampling operations on the receiving light signal LS, wherein sampled values are converted to digital data D1 shown in FIG. 2F. The pulse signal P2 is also delivered to the delay circuit 11, wherein it is delayed by a constant delay time Td and is then output as the pulse signal P3 shown in FIG. 2D. Incidentally, the delay time Td is set in such a way that a pulse P3 is output when the receiving light signal LS decreases to substantially zero level.

The pulse P3 is supplied to the A/D converter 7 via the OR circuit 12 as a sampling pulse PS (see FIG. 2E). Upon receipt of such a sampling pulse PS corresponding to the pulse P3, the A/D converter 7 performs a sampling operation on the receiving light signal LS so as to convert it to digital data D1. The pulse signal P3 is also delivered to the latch circuit 13. Upon receipt of the pulse signal P3, the latch circuit 13 latches an output of the A/D converter 7. Thus, values of the receiving light signal LS, which are sampled at timings of pulses of the pulse signal P2 and are subjected to analog-to-digital conversion, are read by the latch circuit 13, which produces data D2 shown in FIG. 2G. The data D2 are forwarded to the subtraction circuit 14.

Namely, the data D2 (see FIG. 2G) are produced by performing the sampling operation and analog-to-digital conversion on the receiving light signal LS at the timing of the pulse signal P2, so that the data D2 are output from the latch circuit 13 at the timing of the pulse signal P3. In addition, the A/D converter 7 outputs the data D1 (see FIG. 2F), which are produced by performing the sampling operation and analog-to-digital conversion on the receiving light signal LS at the timing of the pulse signal P3. Herein, the receiving light signal LS becomes substantially zero in level at the timing of the pulse signal P3. In other words, the data which are produced by sampling the receiving light signal LS at the timing of the pulse signal P3 are interpreted as noise data. The subtraction circuit 14 subtracts the output of the A/D converter 7 from the output of the latch circuit 13 to produce data D3 shown in FIG. 2H. In other words, the subtraction circuit 14 outputs the data D3 which are produced by subtracting the noise data from the data D2 corresponding to the receiving light signal LS. Thus, it is possible to obtain the data D3 which have an extremely small amount of noise. The data D3 are forwarded to the processing circuit 8, which in turn performs display of the measured signal(s).

Figure 3:
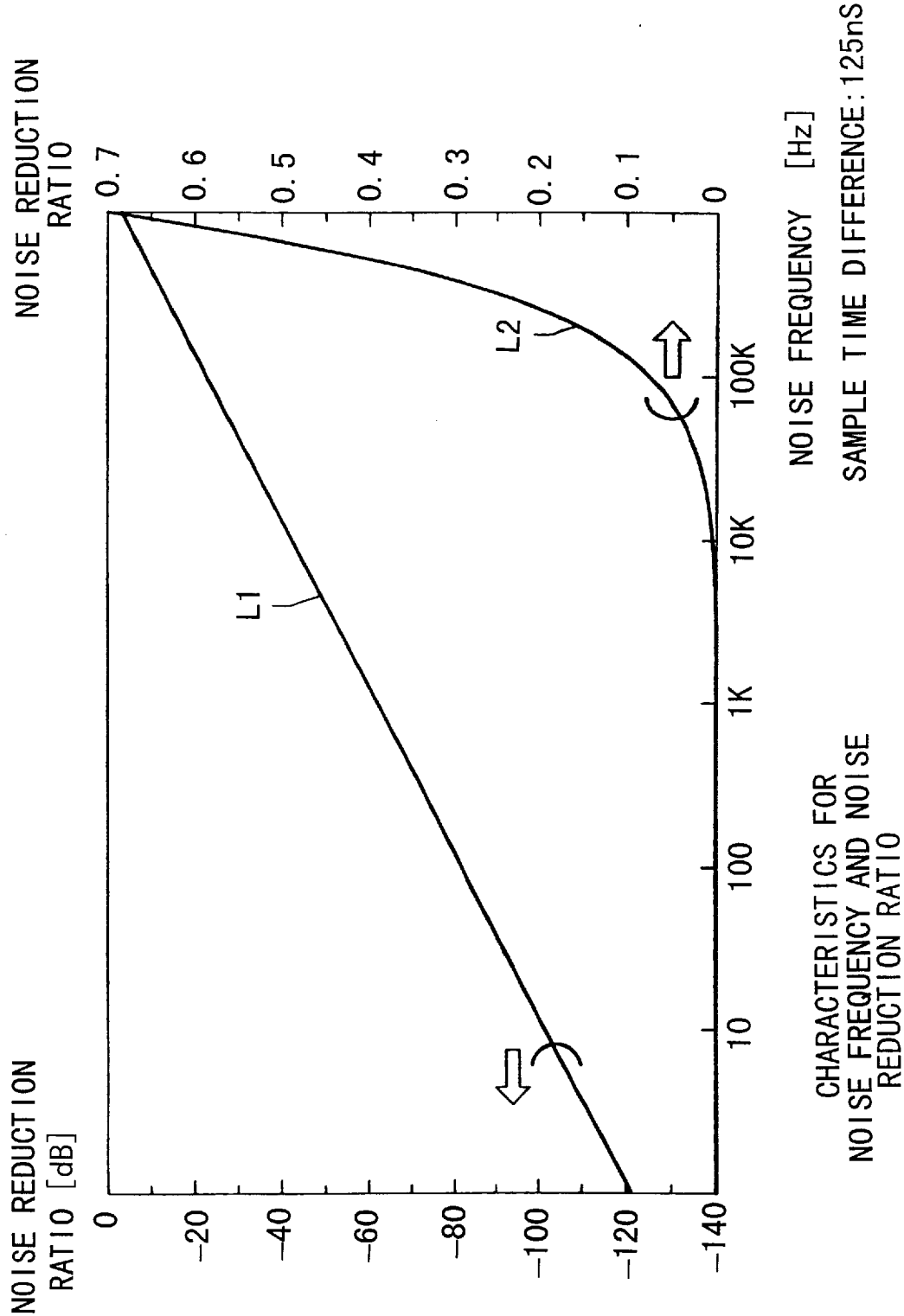
FIG. 3 is a graph showing characteristic curves representing relationships between noise frequency and noise reduction ratio.

As described above, the present embodiment is designed in such a way that data are produced by subtracting the noise from the "sampled" receiving light signal LS, wherein the processing circuit 8 performs a display process based on such data whose noise is substantially eliminated. As a result, it is possible to display contents of the data having a very small amount of noise. Incidentally, the circuit configuration of FIG. 1 is capable of eliminating low-frequency noise. That is, this circuit configuration is effective for elimination of the low-frequency noise shown in FIG. 2I, particularly, the noise whose level greatly changes in a lapse of time. FIG. 3 is a graph showing a relationship between noise frequency and noise reduction ratio with respect to the circuit configuration of FIG. 1. In FIG. 1, a characteristic curve L1 represents variations in decibel (dB) of the noise reduction ratio which is read in connection with a left axis, while a characteristic curve L2 represents variations in real number of the noise reduction ratio which is read in connection with a right axis. Incidentally, this graph of FIG. 3 is created and displayed based on values which are calculated with respect to the sample time difference of 125 nanoseconds.

By the way, in order to achieve a high noise elimination effect, the position on time axis to latch the noise data, i.e., the position of the pulse P3, should be closer to the pulse P2. However, there is a problem that if the pulse P3 is very close to the pulse P2, the A/D converter 7 should sample signal components in addition to noise components. For this reason, it is necessary to determine the delay time Td of the delay circuit 11 in such a way that the pulse P3 is located in proximity to the pulse P2 as closely as possible but the A/D converter 7 does not sample the signal components in addition to the noise components.

As the method for determination of the delay time Td, it is possible to provide the following method.

Measured signal (e.g., EOS correction signal) which is known and which has a small amount of noise is applied to the EOS probe 2, so that measurement is performed while the delay time Td is sequentially changed. Based on the measurement result, it is possible to determine the delay time Td as a time value which has a best result in S/N ratio. Herein, it is possible to employ the known techniques for detection of the S/N ratio and for setting of step changes of the delay time Td. For example, the measured waveform is subjected to Fourier transform so that frequency components of the measured waveform are removed to produce a signal, which is then subjected to power measurement (or integration) so that noise is detected. In addition, intervals between the step changes of the delay time Td are varied by Newton method, for example.

Figure 4A:
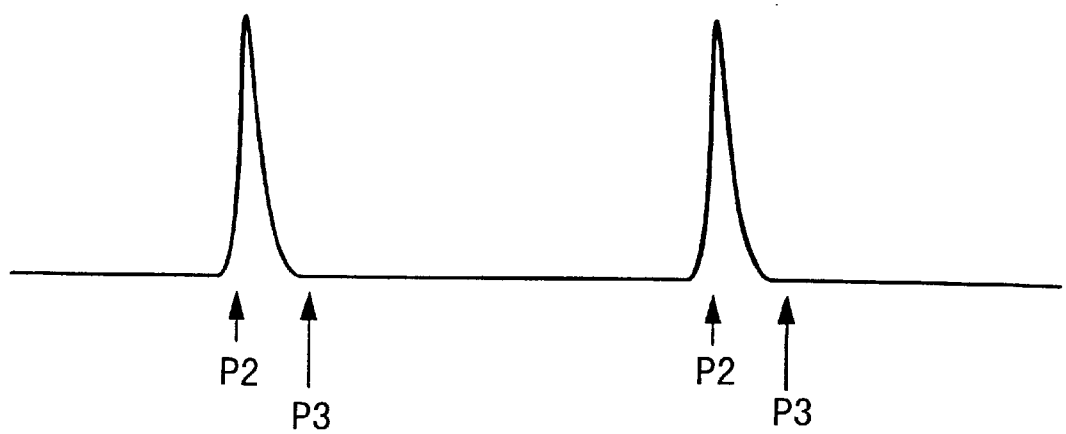
FIG. 4A shows an example of an analog signal waveform in connection with positions of pulses P2 and P3 which are determined with respect to a broad frequency band for amplification.
Figure 4B:
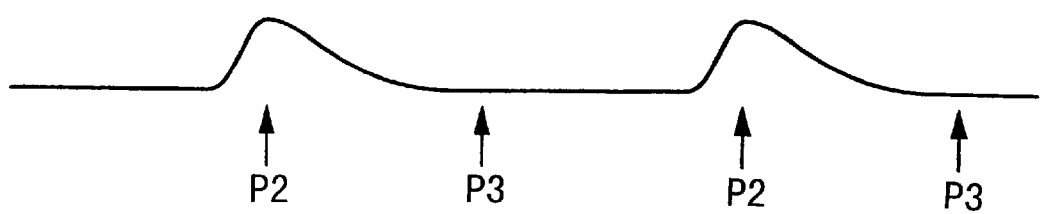
FIG. 4B shows an example of an analog signal waveform in connection with positions of pulses P2 and P3 which are determined with respect to a narrow frequency band for amplification.

The receiving light signal LS greatly changes in waveform by the frequency band employed by the receiving light amplification circuit 6. For example, there are provided two cases, i.e., a first case shown in FIG. 4A where the frequency band of the receiving light amplification circuit 6 is relatively broad and a second case shown in FIG. 4 where the frequency band is relatively narrow. Preferable positions on the time axis for the pulses P2 and P3 are respectively shown in FIG. 4A and FIG. 4B. It can be observed from those figures that positions of the pulses P3 greatly change in response to the frequency bands of the receiving light amplification circuit 6.

Figure 5:
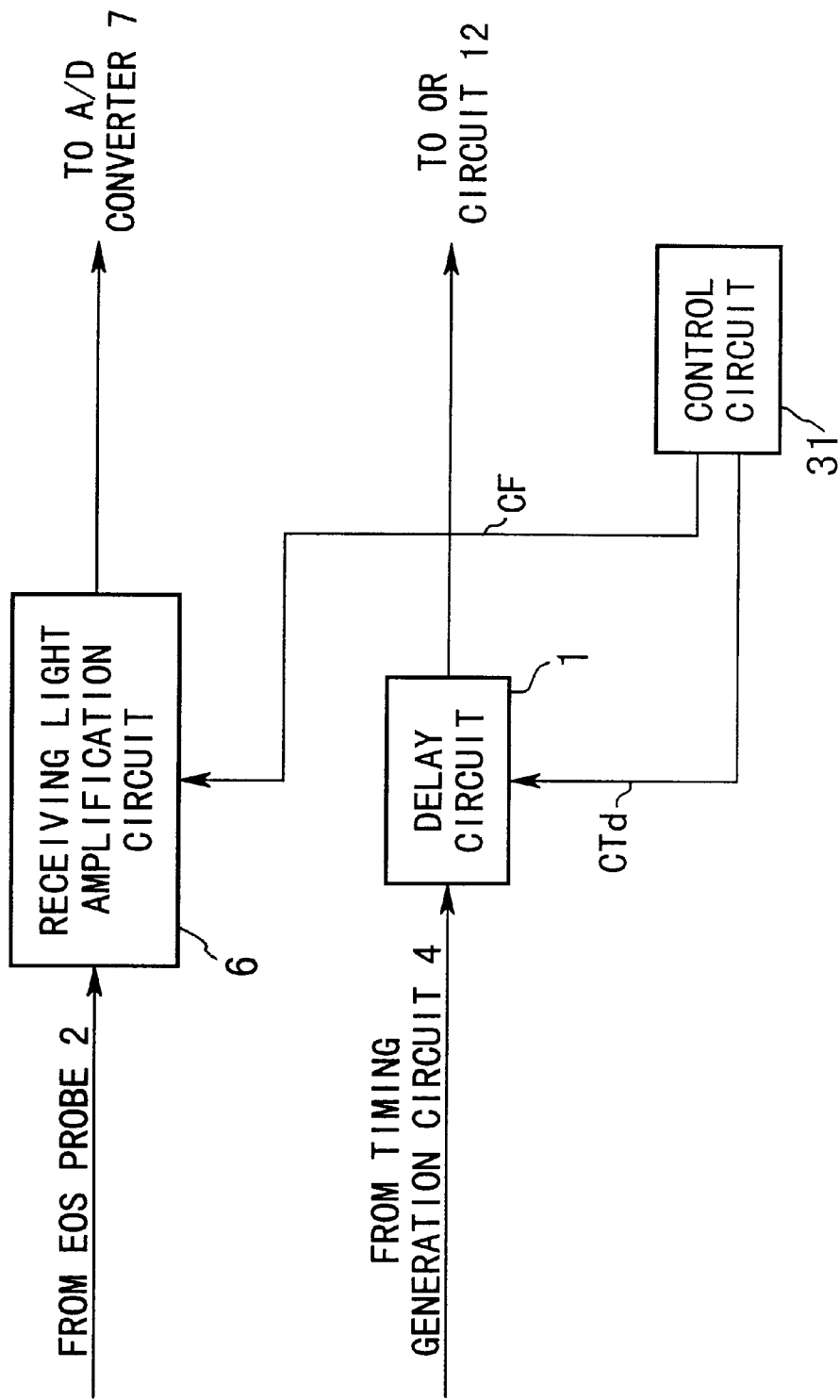
FIG. 5 is a block diagram showing a modified example of the circuit configuration of FIG. 1.

Now, suppose a modified example shown in FIG. 5 that a control circuit 31 is introduced to control the frequency band of the receiving light amplification circuit 6. In the control circuit 31, there is provided a table whose content represents a relationship between band control data CF and delay control data CTd, wherein the band control data CF are used to control the frequency band of the receiving light amplification circuit 6 while the delay control data CTd are used to control the delay time of the delay circuit 11. Herein, it is preferable that when the frequency band of the receiving light amplification circuit 6 is changed, the delay time Td of the delay circuit 11 is changed simultaneously.

Figure 6:
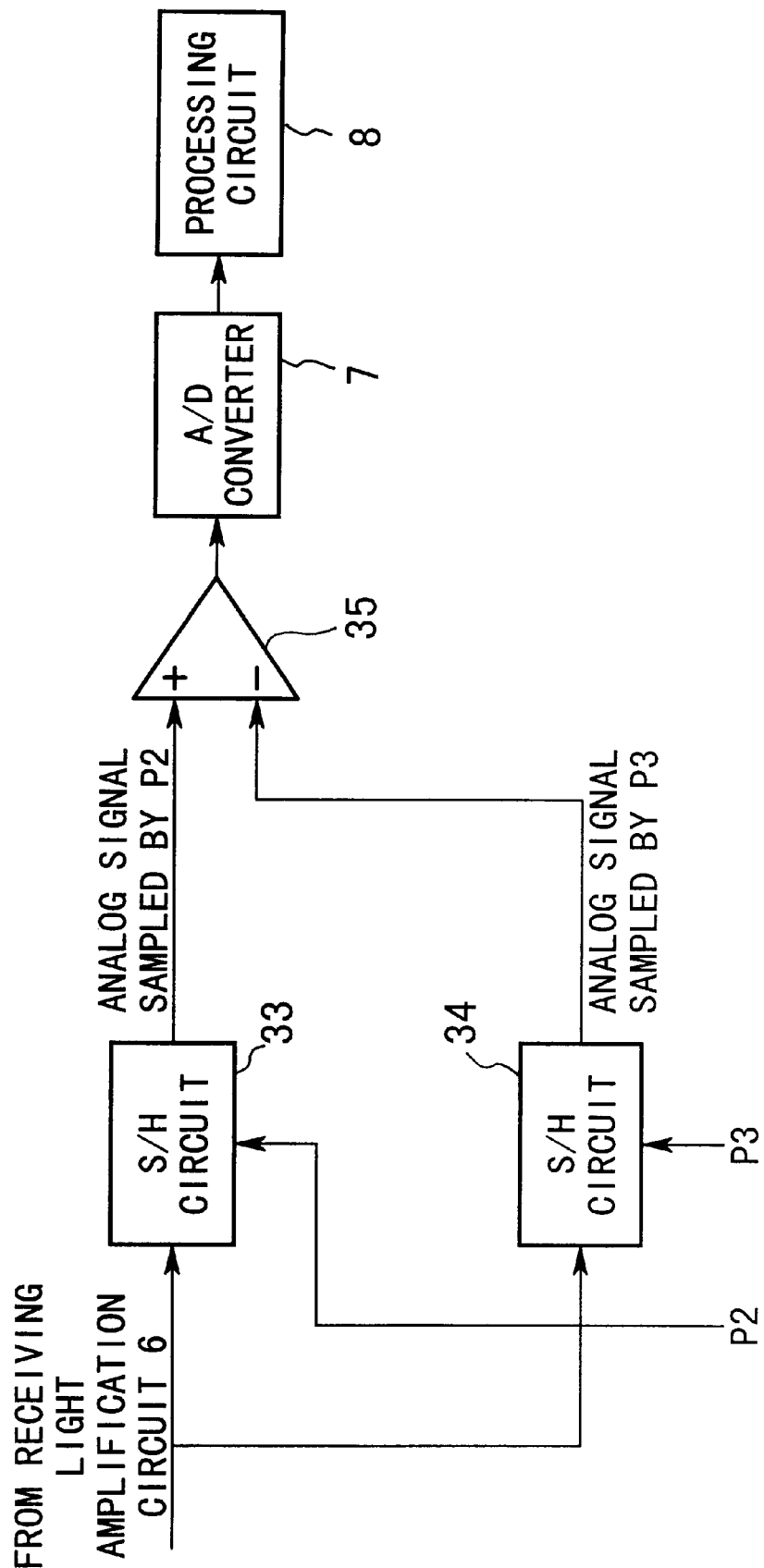
FIG. 6 is a block diagram showing a further modified example of the circuit configuration of FIG. 1.

The present embodiment shown in FIG. 1 is designed such that the output of the receiving light amplification circuit 6 is subjected to analog-to-digital conversion and is then subjected to subtraction of the noise components by the subtraction circuit 14. The present embodiment can be modified such that as shown in FIG. 6, the receiving light amplification circuit 6 is followed by two sample-and-hold circuits (abbreviated by S/H circuits) 33, 34 and a subtracter 35. Herein, the pulse signals P2 and P3 are respectively applied to hold terminals of the S/H circuits 33 and 34. Thus, the S/H circuit 33 holds detection data of the receiving light signal LS while the S/H circuit 34 holds noise data. Then, the subtracter 35 subtracts the noise data from the detection data.

Figure 7:
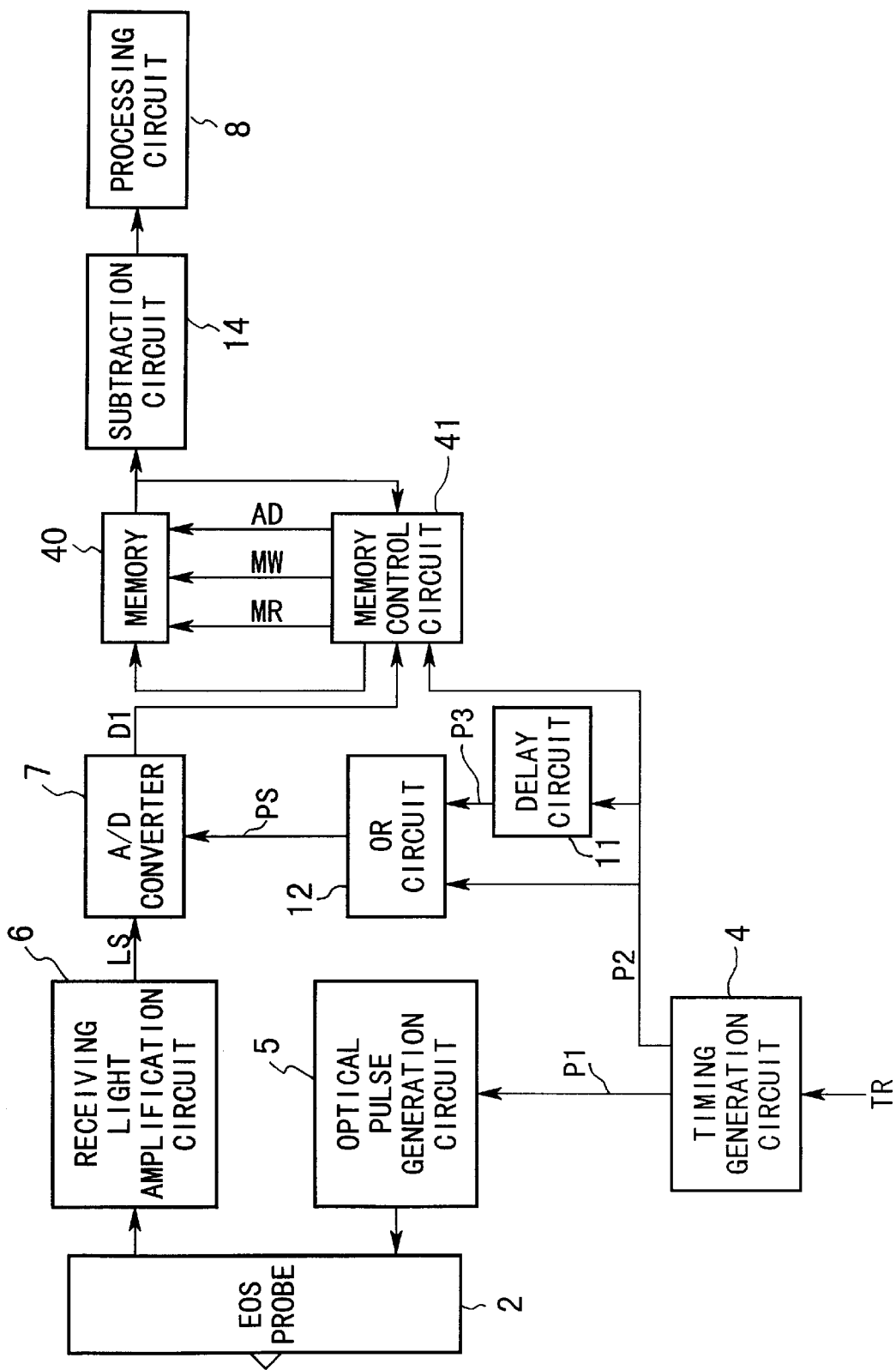
FIG. 7 is a block diagram showing a circuit configuration of the EOS oscilloscope in accordance with another embodiment of the invention.

Next, a description will be given with respect to another embodiment of the invention with reference to FIG. 7. FIG. 7 is a block diagram showing a circuit configuration for the EOS oscilloscope in accordance with another embodiment of the invention. As compared with the aforementioned circuit configuration of FIG. 1, the circuit configuration of FIG. 7 is made such that the latch circuit 13 is replaced by a memory 40 and a control circuit 41.

Now, operations of the EOS oscilloscope of FIG. 7 will be described with reference to time charts shown in FIG. 8A to FIG. 8J. FIG. 8A shows a pulse signal P1 which the timing generation circuit 4 outputs to the optical pulse generation circuit 5. FIG. 8B shows a receiving light signal LS which the receiving light amplification circuit 6 outputs. FIG. 8C shows a sampling pulse signal PS which the OR circuit 12 outputs to the A/D converter 7. FIG. 8D shows data D1 which the A/D converter 7 outputs. The above signals and data are identical in timing and waveform (or data values) to those used in the aforementioned EOS oscilloscope of FIG. 1; hence, the description thereof will be omitted.

FIG. 8E shows an address pulse signal consisting of address output pulses which are created in the memory control circuit 41. FIG. 8F shows content of data representing memory addresses AD, each of which is created by the memory control circuit 41 and is then supplied to an address terminal of the memory 40 at a leading-edge timing of the address output pulse. FIG. 8G shows a memory read signal MR which the memory control circuit 41 outputs to the memory 40. When the memory read signal MR is output, data are read from an address of the memory 40 designated by the memory address AD and are then supplied to the memory control circuit 41. FIG. 8H shows a signal consisting of data load pulses, which are created in the memory control circuit 41. When issuing the data load pulse, the memory control circuit 41 loads the data D1 output from the A/D converter 7. Then, the memory control circuit 41 adds the loaded data D1 to the aforementioned data which are read from the memory 40 and are supplied thereto in response to the memory read signal MR, so that the memory control circuit 41 obtains added data. FIG. 8I shows a memory write signal MW which is created in the memory control circuit 41. At the same time when the memory control circuit 41 outputs the memory write signal MW to the memory 40, the memory control circuit 41 supplies the added data to a data input terminal of the memory 40. Thus, the added data are written into an address of the memory 40 designated by the memory address AD. FIG. 8J shows memory input/output data of the memory 40. As shown in FIG. 8D, the data D1 output from the A/D converter 7 alternatively designate detection data and noise data, while the memory address AD sequentially designates addresses such as address 1, address 2, . . . The memory 40 and the memory control circuit 41 cooperate together to perform sequential addition (or accumulation) with respect to the detection data and noise data respectively. Namely, in FIG. 8j, "MD1" designates previously added data (i.e., added detection data) which are read from address 1 of the memory 40, while "MD2" designates data, which are produced by adding the present detection data (i.e., data D1, see FIG. 8D) to the previously added data read from the address 1 of the memory 40 and which are written into the memory 40. In addition, "MD3" designates previously added data which are read from address 2 of the memory 40, while "MD4" designates previously added data (i.e., added noise data) which are read from address 2 of the memory 40, while "MD4" designates data, which are produced by adding the present noise data (i.e., data D1, see FIG. 8D) to the previously added data read from the address 2 of the memory 40 and which are written into the memory 40.

Figures 9A, 9B:
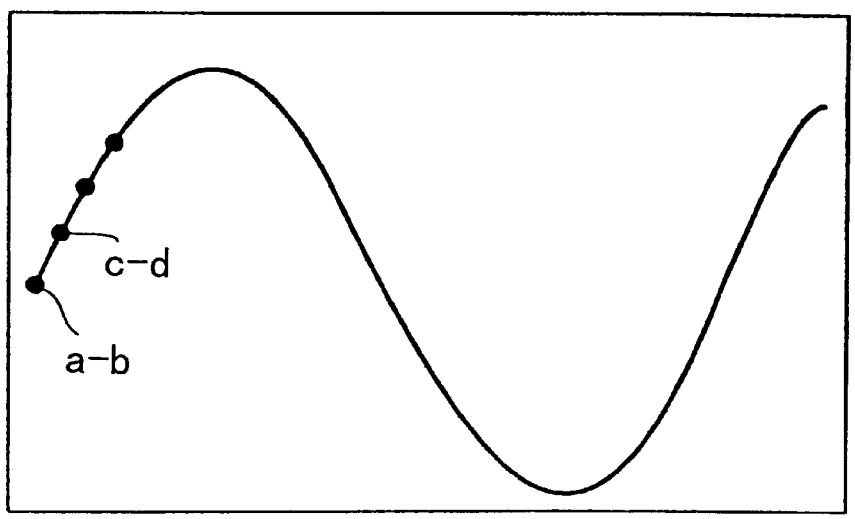
FIG. 9A shows relationships between addresses and contents of data stored in the memory shown in FIG. 7.
FIG. 9B shows an example of an EOS waveform which is displayed based on stored contents of the memory shown in FIG. 7.

FIG. 9A shows relationships between addresses of the memory 40 and contents of data written into the memory 40, while FIG. 9B shows an EOS waveform which is displayed based on the stored contents of the memory 40. As shown in FIG. 9A, first detection data representing a signal magnitude for a leftmost end position of the waveform are written at the address 1 of the memory 1, while first noise data representing a noise magnitude for the leftmost end position of the waveform are written at the address 2 of the memory 1. Hence, the subtracter 14 subtracts the first noise data "b" from the first detection data "a" to designate magnitude for the waveform of FIG. 9B at its leftmost end position.

As described above, the EOS oscilloscope of FIG. 7 is designed such that the added data (e.g., average data), which are produced with respect to data of each sample point every measurement period, are accumulated in the memory 40. Then, the accumulated data are read from the memory at the prescribed timing, so that the subtraction circuit 14 performs subtraction of noise components. Thus, the processing circuit 8 works to display measurement results based on outputs of the subtraction circuit 14.

Lastly, effects of the invention will be described below.
(1) This invention is basically designed such that the measured signal is sampled at two different timings to produce two data, which are then subjected to subtraction. Due to the subtraction, only the signal components are remained while low-frequency noise components are canceled. Thus, it is possible to eliminate or greatly reduce a variety of noises (e.g., low-frequency noise components) such as the noise which is introduced into the receiving light amplification circuit from the external, noise which occurs in the receiving light amplification circuit and optical noise which occurs due to generation of optical pulses.
(2) Because of the elimination or reduction of the noise, it is possible to provide a measured waveform having a good S/N ratio.
(3) Besides, it is possible to offer a good elimination effect for low-frequency noise which greatly varies in level.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. An electro-optic sampling oscilloscope comprising:
an electro-optic sampling probe;
means for producing timing pulses;
optical pulse generation means for generating optical pulses to produce laser beams at a time corresponding to a timing pulse and the optical pulse generation means supplies the optical pulses to said electro-optic sampling probe;
receiving light amplification means for amplifying an output of the electro-optic sampling probe to produce a received light signal;
sampling means for sampling the received light signal at a first prescribed time after production of a timing pulse to produce first signal data, said sampling means also sampling the received light signal at a second prescribed time after production of the timing pulse and after said first prescribed time to produce second signal data;

subtraction means for performing subtraction to produce a difference between the first signal data and the second signal data; and means for displaying the output of the subtraction means.

2. An electro-optic sampling oscilloscope comprising:

an electro-optic sampling probe;

means for generating timing pulses;

optical pulse generation means for generating optical pulses to produce laser beams at a time corresponding to a timing pulse and the optical pulse generation means supplies the optical pulses to said electro-optic sampling probe;

receiving light amplification means for amplifying an output of the electro-optic sampling probe to produce a received light signal;

timing generation means for outputting a first signal at a first prescribed time after production of the timing pulse;

delay means for delaying the first signal by a second prescribed time to produce a second signal;

analog-to-digital conversion means responsive to said first and second signals for sampling the received light signal at times of the first and second signals respectively and for converting the sampled received light signal to corresponding first and second digital data information values;

subtraction means for performing subtraction to produce a difference between the first and second digital data information values; and means for displaying the output of the subtraction means.

3. An electro-optic sampling oscilloscope according to claim 2 further comprising:

control means containing a table storing data representing a relationship between band control data for controlling a frequency band of the receiving light amplification means and delay control data for controlling the second predetermined time by which the delay means delays the first signal, so that the control means controls the frequency band of the receiving light amplification means and the second predetermined time of the delay means respectively on the basis of the data stored in the table.

4. An electro-optic sampling oscilloscope comprising:

optical pulse generation means for generating optical pulses using laser beams at timings of sampling pulses, so that the optical pulse generation means supplies the optical pulses to an electro-optic sampling probe;

receiving light amplification means for amplifying an output of the electro-optic sampling probe so as to produce a receiving light signal;

timing generation means for generating a first pulse signal consisting of pulses which emerge at timings when a first prescribed time elapses from the timings of the sampling pulses respectively;

delay means for delaying the first pulse signal by a second prescribed time to produce a second pulse signal;

analog-to-digital conversion means for sampling the receiving light signal at timings of the first and second pulse signals respectively and for converting the sampled receiving light signal to first and second digital data;

average calculation means for calculating an average value between the first and second digital data every measurement period;

a memory for storing calculation results of the average calculation means;

subtraction means for subtracting a difference between an average value calculated based on the first digital data and an average value calculated based on the second digital data; and means for performing picture display based on an output of the subtraction means.

5. An electro-optic sampling oscilloscope comprising:

optical pulse generation means for generating optical pulses at prescribed timings;

an electro-optic probe to be brought into contact with a circuit being measured for producing an electric signal corresponding to the optical pulses which are varied in polarization states in response to the measured circuit;

amplification means for amplifying the electric signal to produce a received light signal;

first sampling means for sampling the received light signal by using a first signal to produce detection data, each first signal having a time relationship to an optical pulse;

second sampling means for sampling the received light signal by using a second signal to produce noise data, wherein the second signal is delayed from the first signal by a delay time;

subtraction means for subtracting the noise data from the detection data; and processing means for processing an output of the subtraction means to create a waveform representing a result of measurement performed on the circuit.

6. An electro-optic sampling oscilloscope according to claim 5 further comprising control means for controlling a frequency band of the amplification means as well as the delay time.

7. An electro-optic sampling oscilloscope according to claim 5, wherein the delay time is controlled such that the second sampling means samples the received light signal at a time when the level of the received light signal is substantially zero.

8. An electro-optic sampling oscilloscope according to claim 5, wherein the delay time is increased as the frequency band of the amplification means becomes narrower.

9. An electro-optic sampling oscilloscope according to claim 5 further comprising accumulation means for accumulating the detection data and the noise data respectively, so that the subtraction means subtracts the accumulated noise data from the accumulated detection data.

10. An electro-optic sampling oscilloscope according to claim 8, wherein the accumulation means is configured using a memory, wherein the detection data and the noise data are written at different addresses respectively.

* * * * *